United States Patent
Nishikata et al.

(10) Patent No.: US 6,177,710 B1
(45) Date of Patent: Jan. 23, 2001

(54) SEMICONDUCTOR WAVEGUIDE TYPE PHOTODETECTOR AND METHOD FOR MANUFACTURING THE SAME

(75) Inventors: Kazuaki Nishikata, Yokosuka; Koji Hiraiwa, Yokohama, both of (JP)

(73) Assignee: The Furukawa Electric Co., Ltd., Tokyo (JP)

( * ) Notice: Under 35 U.S.C. 154(b), the term of this patent shall be extended for 0 days.

(21) Appl. No.: 09/011,620

(22) PCT Filed: Jun. 13, 1997

(86) PCT No.: PCT/JP97/02049

§ 371 Date: Apr. 27, 1998

§ 102(e) Date: Apr. 27, 1998

(87) PCT Pub. No.: WO97/48137

PCT Pub. Date: Dec. 18, 1997

(30) Foreign Application Priority Data

Jun. 13, 1996 (JP) .................................................. 8-152153

(51) Int. Cl.[7] .................................................. H01L 31/115
(52) U.S. Cl. .......................... 257/429; 257/430; 257/431; 257/432; 257/433; 257/88; 257/79; 257/80; 257/81; 257/82; 257/83; 257/99
(58) Field of Search ............................... 257/429, 88, 79, 257/80, 81, 82, 83, 99, 430, 431, 432, 433

(56) References Cited

U.S. PATENT DOCUMENTS

| | | | | |
|---|---|---|---|---|
| 4,561,007 | * | 12/1985 | Webb | 357/30 |
| 4,838,987 | * | 6/1989 | Dobson | 257/429 |
| 5,054,871 | * | 10/1991 | Deri et al. | 257/429 |
| 5,333,216 | * | 7/1994 | Sakata et al. | 257/430 |

FOREIGN PATENT DOCUMENTS

| | | | |
|---|---|---|---|
| 58-116788 | 7/1983 | (JP) . | |
| 60-234384 | 11/1985 | (JP) . | |
| 62-195191 | 8/1987 | (JP) . | |
| 63-38277 | * 2/1988 | (JP) | H01L/21/205 |
| 63-172482 | 7/1988 | (JP) . | |
| 1-55542 | 3/1989 | (JP) . | |
| 4-241472 | 8/1992 | (JP) . | |
| 5-264870 | 10/1993 | (JP) . | |
| 5-275415 | 10/1993 | (JP) . | |
| 5-275414 | * 10/1993 | (JP) | H01L/21/306 |
| 7-193224 | 7/1995 | (JP) . | |
| 63-38277 | 2/1998 | (JP) . | |

* cited by examiner

Primary Examiner—Carl Whitehead, Jr.
Assistant Examiner—Matthew E. Warren
(74) Attorney, Agent, or Firm—Frishauf, Holtz, Goodman, Langer & Chick, P.C.

(57) ABSTRACT

A semiconductor waveguide type photo detector capable of preventing leak current from occurring and excellent in dark current characteristics, and a manufacturing method thereof are provided. In a semiconductor waveguide type photo detector, a layered structure is formed on a semiconductor substrate, the layered structure formed by building a first semiconductor layer, a second semiconductor layer and a third semiconductor layer in due order, the first semiconductor layer being of one of p type and n type, the second semiconductor layer having lower band gap energy than that of the first semiconductor layer, the third semiconductor layer having higher band gap energy than that of the second semiconductor layer and having a conductive type opposite to that of the first semiconductor layer, and wherein at least the second semiconductor layer of the layered structure has a semiconductor waveguide having a mesa stripe structure, and at least a side surface and/or a light incidence end face of the second semiconductor layer is curved.

5 Claims, 5 Drawing Sheets

FIG. 1 (CONVENTIONAL SEMICONDUCTOR WAVEGUIDE)

SEMICONDUCTOR WAVEGUIDE TYPE PHOTODETECTOR AND METHOD FOR MANUFACTURING THE SAME

TECHNICAL FIELD

The present invention relates to a semiconductor waveguide type photo detector and a manufacturing method thereof. Particularly, the present invention relates to a photo detector having a semiconductor waveguide capable of reducing leak current during operation time and excellent in low dark current characteristics and to a manufacturing method thereof.

BACKGROUND ART

Figure 1:
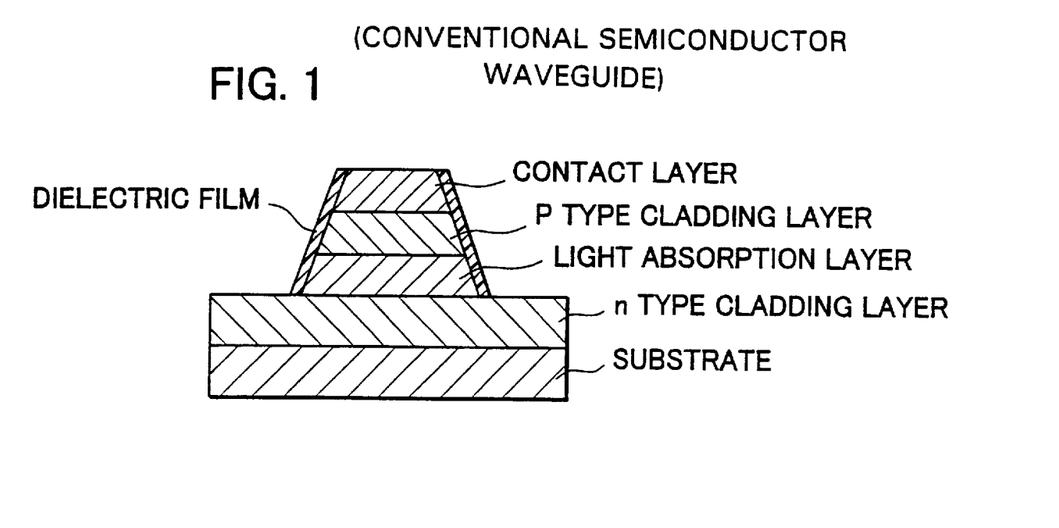
FIG. 1 is a cross-sectional view showing an example of the side surface shape of a mesa stripe structure of the semiconductor waveguide of the conventional photo detector.

FIG. 1 shows a cross-sectional structure of a conventional semiconductor waveguide for use in a photo detector.

The semiconductor waveguide forms a semiconductor lamination structure by sequentially forming a n type cladding layer, a low carrier concentration light absorption layer, a p type cladding layer and a contact layer on a semiconductor substrate in due order.

Those layers provided above the n type cladding layer are of mesa stripe shape extending in the optical waveguide direction (which is the direction perpendicular to the drawing sheet). Side surfaces of the mesa stripe structure are each covered with a dielectric film. An electrode (not shown) is mounted on the contact layer and an electrode (not shown) on the back surface of the semiconductor substrate, thereby constituting a photo detector as a whole.

The band gap energy of the light absorption layer is set lower than that of the p type cladding layer situated above and that of the n type cladding layer situated below, and a signal light incident on the light incidence end face of the light absorbing layer is guided to the light absorption layer.

If reverse voltage is applied between the p type cladding layer and the n type cladding layer, then a depletion layer is formed within the low carrier concentration light absorption layer and the signal light guided to the light absorption layer is converted into a photoelectric signal by the function of the high electric field generated within the aforementioned depletion layer.

That is, in the conventional photo detector, excitation carriers within the depletion layer generated by the incident signal light are detected as photoelectric current. The excitation carriers are separated and drifted by the electric field generated within the depletion layer. In case of holes, the carriers reach the p type cladding layer. In case of electrons, the carriers reach the n type cladding layer. In both cases, the excitation carriers contribute to photoelectric current.

The reason the lamination structure of the semiconductor device is made to be of mesa stripe shape is to increase the operating speed of the photo detector.

Specifically, to increase the operating speed of the photo detector, it is necessary to decrease electric capacity generated within the depletion layer at the time of applying reverse voltage as mentioned before. This can be effectively realized by reducing the cross-sectional area of the light absorption layer and therefore that of the depletion layer formed during the application of reverse voltage.

To realize this, in principle, only the light absorption layer might be etched to have a mesa stripe shape. In practice, however, as shown in FIG. 1, all portions provided above the n type cladding layer are etched to be mesa stripe shaped. Sometimes, part of the n type cladding layer is simultaneously etched as well as those portions.

In addition, the dielectric film is provided for decreasing leak current flowing through the side surface of the mesa stripe structure during the operation of the photo detector.

It is known that leak current flows by way of the surface level and defects of the side surface of the mesa stripe structure. It is thus possible to prevent the surface level and defects from causing the leak current to flow by coating the mesa stripe side surface with a dielectric film.

Meanwhile, in the photo detector as mentioned above, for purposes of making the light enter into the device effectively, light incidence end faces are usually provided by cleavage. The light incidence end face formed by cleavage is flat in terms of atom level and light can enter the waveguide without scattering. The light incidence end face is coated with a nonreflective film made of $SiO_2$ or SiNx to prevent the reflection of the incident light.

The biggest problem with the photo detector of the above-described structure is that leak current flows through side surfaces of the mesa stripe structure while the photo detector is in operation.

As described above, to prevent the leak current, side surfaces thereof are coated with the dielectric films. However, such coating does not always prevent leak current sufficiently.

Furthermore, to the best of the present inventors' knowledge, considerable high leak current flows even on the cleaved light incidence end face.

It is therefore an object of the present invention to provide a novel semiconductor waveguide type photo detector capable of preventing leak current from flowing on mesa stripe side surfaces and cleaved light incidence end faces while the device is in operation.

It is another object of the present invention to provide a method of manufacturing the aforesaid semiconductor waveguide type photo detector.

DISCLOSURE OF THE INVENTION

To obtain the above-described object, the inventors of the present invention devoted deep study to the present invention. In the course of study, the inventors paid their attention to the fact that the surface level density of a semiconductor is strongly affected by dangling bond density. To be specific, if the dangling bond density increases, the surface level of the semiconductor concerned tends to show metal characteristics.

From this viewpoint, the following consideration was given to the formation of a mesa stripe structure by etching the semiconductor layered structure as described above.

Wet etching or dry etching is usually utilized for the formation of a mesa stripe structure. If ordinary etching conditions are adopted and, for example, a GaInAsP layer is etched in the direction parallel to (0-1-1) plane by using methanol bromide as etchant, then the side surface of the formed mesa stripe structure becomes a low index surface such as (111) plane, (110) plane or (100) plane, which fact is known.

In case of dry etching using methane gas type etchant or the like having strong chemical reactivity or using chlorine gas type etchant having also strong physical reactivity, it is also known that the side surface of the mesa stripe structure becomes a low index surface, as well.

Meanwhile, in case of a low index surface such as (111) plane, the number of atoms in a unit cell is large and therefore the number of dangling bond is also large.

For example, in GaInAs which is lattice-matched to InP, the dangling bond density on the (111) plane is very high, i.e. $6.7 \times 10^{14}$ atoms/cm$^2$.

In such a state, since the surface level tends to have metal characteristics, leak current or leak flow easily occurs. This is true for other low index surfaces such as (110) plane and (100) plane.

On the other hand, in case of cleaved light incidence end faces as described above, it is known that the cleaved light incidence end face made under ordinary cleavage conditions also becomes a low index surface such as (011) plane.

Thus, the surface level of the (cleaved) light incidence end face tends to show metal characteristics, so that leak current easily occurs.

As a result of a series of considerations, the inventors of the present invention had such a technical concept in mind that if the dangling bond density on the side surface of the mesa stripe structure resulting from etching or on the light incidence end face resulting from cleavage is decreased, it is possible to prevent leak current from occurring. Based on this technical concept, the inventors worked hard further and finally developed a semiconductor waveguide type photo detector and its manufacturing method of the present invention.

That is, the present invention provides a semiconductor waveguide type photo detector, characterized in that a layered structure is formed on a semiconductor substrate, the layered structure formed by building a first semiconductor layer, a second semiconductor layer and a third semiconductor layer, the first semiconductor layer being of one of a p type and an n type, the second semiconductor layer being provided on the first semiconductor layer and having a lower band gap energy than that of the first semiconductor layer, the third semiconductor layer being provided on the second semiconductor layer, having a higher band gap energy than that of the second semiconductor layer, and having a conductive type opposite to that of the first semiconductor layer, and in that at least the second semiconductor layer of the layered structure includes a semiconductor waveguide having a mesa stripe structure, and a side surface and/or a cleaved light incidence end face of at least the second semiconductor layer is curved.

The present invention also provides a semiconductor waveguide type photo detector, characterized in that in the aforementioned layered structure, the light incidence end surface of at least the aforesaid second semiconductor layer is an inclined plane at an acute angle with respect to the surface of the semiconductor substrate.

Moreover, the present invention provides a method of manufacturing a semiconductor waveguide type photo detector, characterized by comprising the steps of: forming a layered structure by building a first semiconductor layer, a second semiconductor layer and a third semiconductor layer, the first semiconductor layer being of one of a p type and an n type, the second semiconductor layer being provided on the first semiconductor layer and having a lower band gap energy than that of the first semiconductor layer, the third semiconductor layer being provided on the second semiconductor layer, having a higher band gap energy than that of the second semiconductor layer, and having a conductive type opposite to that of the first semiconductor layer; and etching the layered structure to provide a mesa stripe shaped upper portion including at least the second semiconductor layer, characterized in that when at least the second semiconductor layer is etched, one of a solution containing tartaric acid, a solution containing bromine and a mixture liquid of hydrochloric acid, acetic acid and hydrogen peroxide is used.

In particular, the present invention provides a method of manufacturing a semiconductor waveguide type photo detector, characterized in that after the mesa stripe shape is formed, etching is performed by using a solution containing bromine so that a side surface of at least the second semiconductor layer is curved, and also provides a method of manufacturing a semiconductor waveguide type photo detector, characterized in that after a light incidence end face is formed by etching or cleaving the layered structure, etching is performed by using a solution containing bromine or a solution containing tartaric acid so that the light incidence end face of at least the second semiconductor layer is curved.

In the present invention, both of the first and third semiconductor layers have a function of cladding layer and/or light absorption layer.

Also, the present invention includes a case where other semiconductor layers are interposed between the first and second semiconductor layers and between the second and third semiconductor layers as necessary.

A semiconductor waveguide for use in the manufacture of a photo detector according to the present invention will now be described with reference to FIG. 2.

Figure 2:
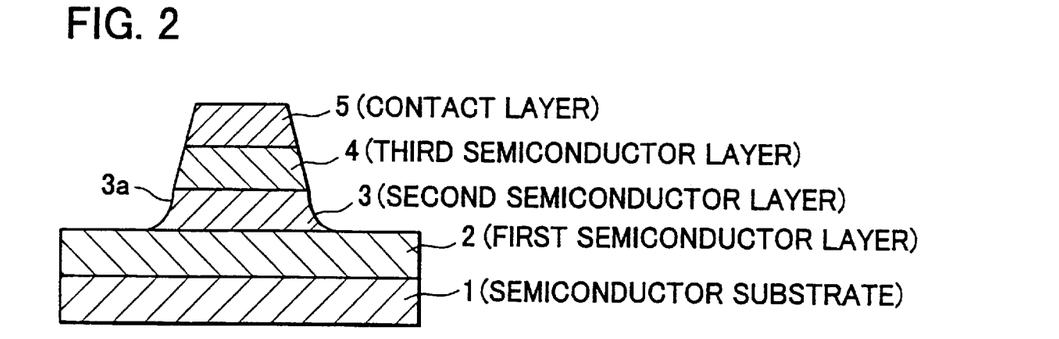
FIG. 2 is a cross-sectional view of the basic side surface shape of a mesa stripe structure of a semiconductor waveguide of a photo detector according to the present invention.

As shown in FIG. 2, a first semiconductor layer 2, a second semiconductor layer 3, a third semiconductor layer 4 and a contact layer 5 are sequentially provided on a semiconductor substrate 1 in due order, thereby forming a lamination structure. Those portions which are provided above the first semiconductor layer 2 are formed of mesa stripe shape extending in the optical waveguide direction (or in the direction perpendicular to the drawing sheet).

The mesa stripe shape is not limited to the configuration shown in FIG. 2. It is possible to include part of the first semiconductor layer 2 in the mesa stripe structure.

The first semiconductor layer 2 is of an n type or a p type conductive type and serves as a lower part cladding layer. The second semiconductor layer 3 provided on the first semiconductor layer 2 has a lower band gap energy than the first semiconductor layer 2. The second semiconductor layer 3 serves as a light absorption layer.

The third semiconductor layer 4 provided on the second semiconductor layer 3 has a higher band gap energy than the second semiconductor layer 3. The third semiconductor layer 4 is opposite in conductive type to the first semiconductor layer 2 and serves as an upper part cladding layer. The contact layer 5 is provided on the third semiconductor layer 4 for having ohmic contact with an electrode to be provided on the contact layer 5.

In this mesa stripe structure, the side surface 3$a$ of at least the second semiconductor layer (or light absorption layer) 3 is curved.

With such a curved surface, a unit cell area thereof is larger than the unit cell area of the low index flat surface described above, thereby reducing the dangling bond density. In addition, the coupling among the dangling bond is accelerated to reduce the surface energy of crystals on the curved surface and therefore the dangling bond density of a unit cell is lowered. Because of the curved surface, a leak path is lengthened and the intensity of an electric field is lowered. As a result, leak current is considerably prevented from occurring on the curved surface.

According to the present invention, at least part of the side surface 3$a$ of the second semiconductor layer (or light absorption layer) 3 which guides the light wave and should have a depletion layer formed when reverse voltage is applied, should be curved, while other semiconductor layers can have a flat surface. Alternatively, the other semiconductor layers can have the same curved surface as that of the second semiconductor layer 3.

Figure 3:
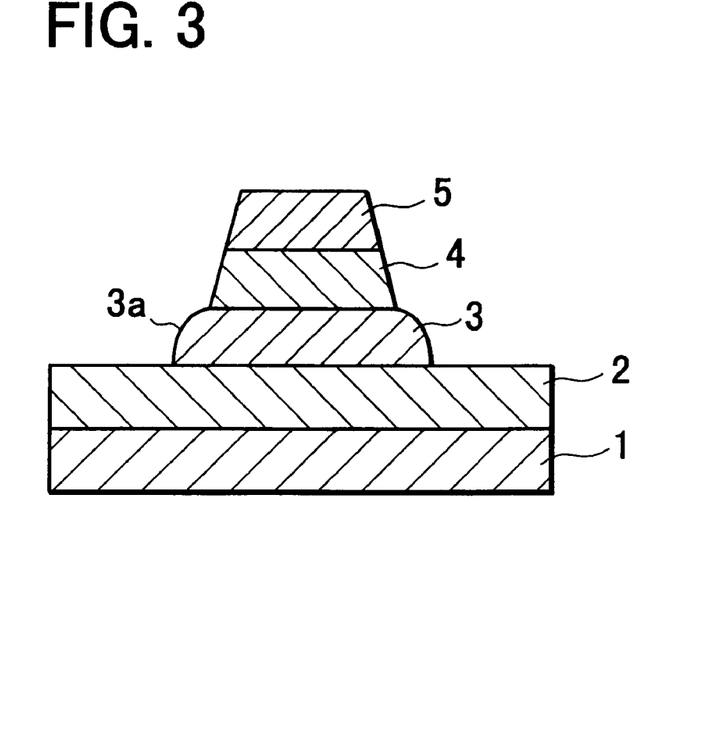
FIG. 3 is a cross-sectional view of another basic side surface shape of the mesa stripe structure according to the present invention.

FIG. 2 illustrates exemplarily that the side surface 3a of the second semiconductor layer 3 is curved to have a projection inside. However, as shown in FIG. 3, the curved side surface 3a can be projected outside. Furthermore, the curved surface is not limited to a curve having a certain radius of curvature as a whole, but it can have different radiuses of curvature at some points. In this case, although the radius of curvature should not be specifically limited, it is preferably set to fall within the range of 5 to 200 μm.

It is noted that FIG. 2 illustrates a typical basic structure of a waveguide in a semiconductor waveguide type photo detector according to the present invention. It is, of course, possible to include a structure wherein a first semiconductor layer (or lower part cladding layer) 2 is not provided, in the present invention.

The present invention can be further realized if other optical waveguide layers are provided above or below the second semiconductor layer (or light absorption layer) 3. In that case, too, the advantage of the present invention can be produced if the side surface of at least the second semiconductor layer 3 is curved.

The above-described semiconductor waveguide can be manufactured as follows.

First, a first semiconductor layer 2, a second semiconductor layer 3, a third semiconductor layer 4 and a contact layer 5 are sequentially provided on a semiconductor substrate in due order using an ordinary method, thereby forming a lamination structure.

Next, the resultant lamination structure is etched and a mesa stripe structure is formed. As an etching process, ordinary dry etching or wet etching is applicable.

During the etching process, wet etching is conducted on at least the side surface of the mesa stripe structure in the second semiconductor layer 3 by using a solution containing water-saturated tartaric acid, a solution containing bromine, or a mixture liquid of hydrochloric acid, acetic acid and hydrogen peroxide, as an etchant. As a result, the side surface 3a of the second semiconductor layer 3 is curved.

If the second semiconductor layer 3 is made of, for example, AlGaInAs material, a mixture liquid of water-saturated tartaric acid and hydrogen peroxide is preferably used as etchant. In this case, the size of the radius of curvature of the curved surface to be formed can be controlled by changing the concentration of the tartaric acid or etching temperature.

Here, the mixture ratio of water-saturated tartaric acid to hydrogen peroxide is preferably set to fall within the range of 20:1 to 20:2. Within this range, the etching speed hardly changes and thereby provide a stable etching process. In addition, within this range, the etching speed is insensitive to a temperature change, making it unnecessary to strictly control temperature. Nevertheless, in consideration that hydrogen peroxide tends to evaporate, it is preferable to set a temperature at 18 to 25° C.

If the second semiconductor layer 3 is made of GaInAsP material, it is preferable that a mesa stripe structure having flat side surfaces is formed by dry etching and thereafter wet etching is conducted using an etchant containing bromine such as a mixture liquid of water-saturated bromine, hydrogen bromide and water; a mixture liquid of hydrochloric acid, acetic acid and water; or a mixture liquid of water-saturated tartaric acid and water.

If a mixture liquid of water-saturated bromine, hydrogen bromide and water is used as an etchant, it is preferable to set the mixture ratio to approximately 1:1:10. If used at low temperature, an uneven reaction tends to occur. It is therefore desirable to set a working temperature to approximately 18 to 20° C. With the above-described mixture liquid and the etching target is GaInAsP, the etching speed does not change no matter what the composition is. In other words, the mixture liquid is a equal velocity etchant and is optimum for a forming process of the semiconductor waveguide type photo detector having a lamination structure composed of GaInAsP of various compositions.

If a mixture liquid of hydrochloric acid, acetic acid and water is used as an etchant, the mixture ratio is preferably set to approximately 1:2:1. Since the mixture liquid generates heat of reaction during preparation and the temperature of the solution increases, the mixture liquid is cooled to approximately 18 to 25° C. during etching process.

The surface of the semiconductor waveguide thus manufactured is coated with a dielectric film. Electrodes are mounted on the surface of the contact layer 5 and the back surface of the semiconductor substrate 1, respectively by an ordinary method. A nonreflective film is formed on the light incidence end face. As a result, a photo detector according to the present invention is obtained.

Description has been given to the case of preventing leak current from occurring on the side surface of the mesa stripe structure. As described before, leak current even occurs on the cleaved end face serving as a light incidence surface.

For purposes of preventing this, the cleaved light incidence end face of at least the second semiconductor layer (or light absorption layer) 3 is made to be curved as in the case of the side surface of the mesa stripe structure described above.

In this case, if at least the second semiconductor layer (or light absorption layer) 3 on the light incidence end face is curved to have a projection outside, not only the occurrence of leak current thereon can be prevented but also the incident light can be collected toward the second semiconductor layer (or light absorption layer) 3 due to the lens effect of the curved face. Thereupon, the absorption which does not contribute to the photoelectric current generated in the contact layer 5 can be decreased, so that the light receiving sensitivity can be preferably improved.

Figure 4:
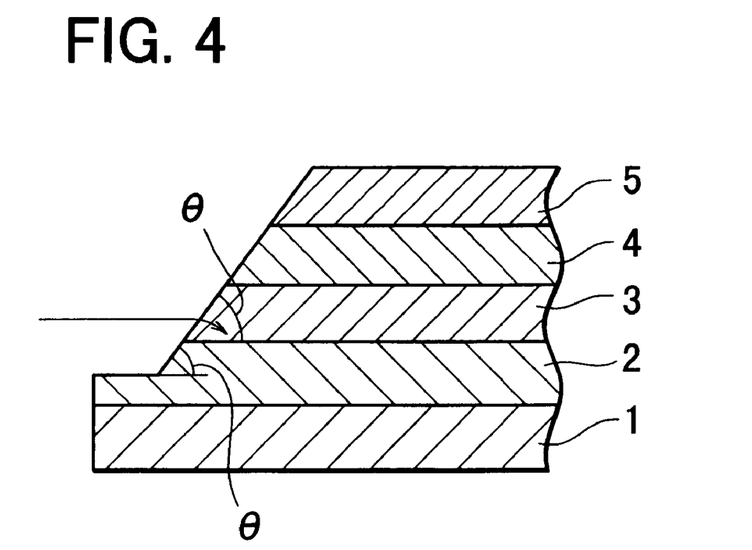
FIG. 4 is a cross-sectional view showing a case where a light incidence end face is a plane.

As for the light incidence end face, it is preferable that the light incidence end face of at least the second semiconductor layer (or light absorption layer) 3 is an inclined plane such that the angle θ with respect to the surface (lamination surface) of the semiconductor substrate 1 is an acute angle as shown in FIG. 4.

In the case where the light incidence end face is formed as a plane inclined from a plane such as the (011) plane formed by cleavage or the like, even if the light incidence end face is a plane, the dangling bond density in the unit cell is decreased, so that leak current can be prevented from occurring. Also, if the inclination angle of the light incidence end face (plane) is set to be an acute angle (θ) with respect to the surface (horizontal plane) of the semiconductor substrate 1, the light incident substantially in parallel with the second semiconductor layer (or light absorption layer) 3 can be refracted toward the semiconductor substrate 1 on the light incidence end face as indicated by an arrow in FIG. 4. Therefore, the absorption which does not contribute to the photoelectric current generated in the contact layer 5 can be decreased, so that the light receiving sensitivity is increased.

In this case, if the inclination angle (θ) of the light incidence end face with respect to the semiconductor substrate 1 is a so-called Brewster angle, the light incident with P polarization is completely nonreflective, so that the coupling loss is preferably reduced.

When light goes from a medium 1 to a medium 2, the Brewster angle is expressed as the following equation:

$$\theta_B = \cot^{-1}(n_2/n_1)$$

where $\theta_B$ is the supplementary angle of incident angle, $n_1$ is the refractive index of medium 1, and $n_2$ is the refractive index of medium 2. If the medium 1 is air and the medium 2 is a semiconductor material, $n_1=1$ and $n_2 \cong 3.5$, so that $\theta_B \cong 16°$.

Such a light incidence end face (plane) can be formed by dry etching, and a desirable inclination angle (θ) can be obtained by changing the etching conditions.

Also, when the second semiconductor layer 3 is made of GaInAsP material, the mesa stripe structure to be formed may be in the direction of plane (011), and etching may be done by using a mixture liquid of methanol and bromine. At this time, the inclination angle (θ) can be adjusted by changing the mixing ratio of methanol and bromine.

BEST MODE OF CARRYING OUT THE INVENTION

Embodiment 1

Figure 5:
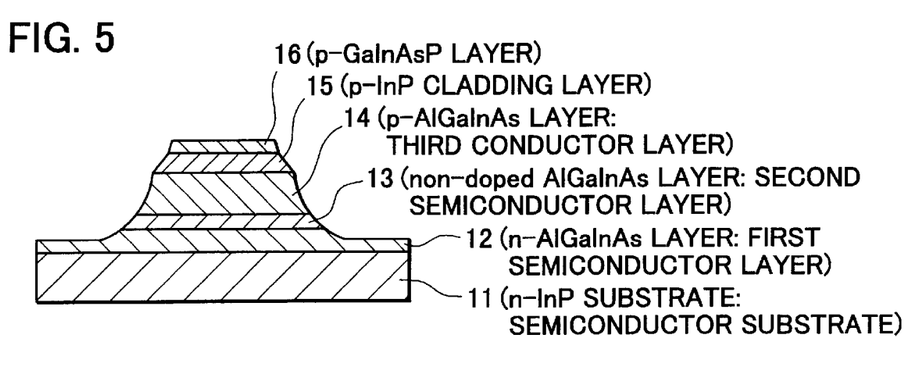
FIG. 5 is a cross-sectional view showing the shape of the side surface of a mesa stripe structure in a first embodiment according to the present invention.

A semiconductor waveguide having a layered structure as shown in FIG. 5 was manufactured as follows.

On a n-InP substrate 11 having a carrier concentration of $5 \times 10^{18} \text{cm}^{-3}$, there were an n-AlGaInAs layer (or light confining layer) 12 having a carrier concentration of $1 \times 10^{18} \text{cm}^{-3}$, a band gap wavelength of 1.2 μm and a thickness of 3 μm, a non-doped AlGaInAs layer (or light absorption layer) 13 having a band gap wavelength of 1.4 μm and a thickness of 0.07 μm, a p-AlGaInAs layer (or light confining layer) 14 having a carrier concentration of $1 \times 10^{18} \text{cm}^{-3}$, a band gap wavelength of 1.2 μm and a thickness of 3 μm, a p-InP cladding layer 15 having a carrier concentration of $1 \times 10^{18} \text{cm}^{-3}$ and a thickness of 2 μm, and a p-GaInAsP layer (or a contact layer) 16 having a carrier concentration of $2 \times 10^{18} \text{cm}^{-3}$, a band gap wavelength of 1.55 μm and a thickness of 0.3 μm in due order.

The composition of each of the semiconductor layers was selected to lattice-match the n-InP substrate 11. Regions of 0.3 μm in the n-AlGaInAs layer (which is the first semiconductor layer according to the present invention) and the p-AlGaInAs layer (which is the third semiconductor layer according to the present invention) contacting with the non-doped AlGaInAs layer (which is the second semiconductor layer according to the present invention) 13 were in a non-doped state.

An etching process as described hereinafter was conducted to the lamination structure to thereby form a mesa strip structure. It is noted that the mesa strip structure to be formed was in such a direction as to provide an forward mesa stripe structure by etching, i.e., in the direction of plane (011).

(1) First, using a mixture solution (A) of water-saturated tartaric acid and hydrogen peroxide with a mixture volume ratio of 20:1, the p-GaInAsP layer 16 was etched at room temperature. In this case, the side surface of the mesa stripe structure formed by etching had a flat shape. Since the solution (A) did not dissolve InP, etching was stopped automatically on the surface of the p-InP cladding layer 15.

(2) Next, using a mixture solution (B) of hydrochloric acid and phosphoric acid with a mixture volume ratio of 3:1, the p-InP cladding layer 15 was etched at room temperature. In this case, the side surface of the mesa stripe structure formed by this etching had a flat shape having a more gradual inclination than that of the side surface of the mesa stripe structure described in (1). Since the solution (B) did not dissolve AlGaInAs, etching was stopped automatically on the surface of the p-AlGaInAs layer (or light confining layer) 14.

(3) Furthermore, using the above-described solution (A), the p-AlGaInAs layer (or light confining layer) 14 and the non-doped AlGaInAs layer (or light absorption layer) 13 were etched at room temperature. When the n-AlGaInAs layer (or light confining layer) 12 was etched by 0.2 μm, etching was stopped. Etching depth was controlled in accordance with etching time.

As a result, a part of the n-AlGaInAs layer 12, the non-doped AlGaInAs layer 13 and the p-AlGaInAs layer 14 on the side surface of the mesa stripe structure were provided with a curved portion having a projection inside. The curved surface was observed by a scanning electron microscope and the radius of curvature was measured as 15 μm. The average inclination of the entire mesa stripe structure was approximately 50°.

Thereafter, a dielectric film was formed on the entire surface and part of the dielectric film on the upper surface of the mesa stripe structure was removed. A p-type ohmic electrode having a 50 μm square was formed on the p-GaInAsP layer 16 by vaporization and an n-type ohmic electrode was mounted on the back surface of the n-InP substrate 11 by vaporization. SiNx was vapor-deposited on the end face at the light incidence side to form a nonreflective film. In this way, a photo detector was manufactured.

The above described photo detector has a wavelength selection function which absorbs light of a wavelength of 1.3 μm but not light of a wavelength of 1.55 μm.

Signal light was incident on the photo detector from an optical fiber having a mode field diameter of 6 μm and light receiving sensitivity was measured. It was found that the photo detector received light of a wavelength of 1.3 μm with a high sensitivity of 0.93 A/W.

Also, signal light was incident on the photo detector from a multimode optical fiber having a mode field diameter of 50 μm and light receiving sensitivity was measured. It was found that the photo detector received light of a wavelength of 1.3 μm with a high sensitivity of 0.7 A/W.

When dark current was measured at a reverse bias voltage of 3 V, an average measured value of 100 devices was quite low of 10 pA. Compared with the fact that the dark current of the conventional waveguide type photo detector is approximately 1 nA to 10 nA, dark current characteristics of the photo detector in this embodiment according to the present invention were improved by approximately three to four digits. The cause of the improved dark current characteristics according to the present invention was analyzed. Diffusion current was negligibly low, current flowing through the incidence end face was 4 pA, current generated at the interface and the light absorption layer was 6 pA and surface current flowing through the side surface of the mesa stripe structure was less than a detection limit. As is obvious from this, if the side surface of the mesa stripe structure was curved, surface current flowing therethrough was reduced and dark current characteristics were therefore considerably improved.

Embodiment 2

Figure 6:
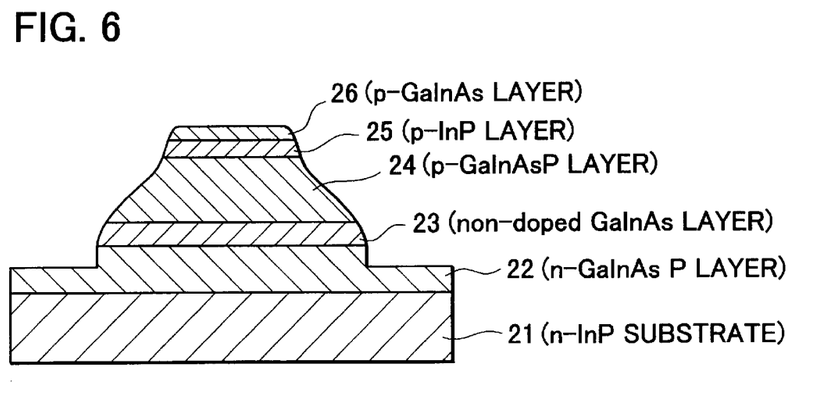
FIG. 6 is a cross-sectional view showing the shape of the side surface of a mesa stripe structure in a second embodiment according to the present invention.

A semiconductor waveguide having a layered structure as shown in FIG. 6 was manufactured as follows.

On an n-InP substrate 21 having a carrier concentration of $5 \times 10^{18} cm^{-3}$, there were provided an n-GaInAsP layer (or light confining layer) 22 having a carrier concentration of $1 \times 10^{18} cm^{-3}$, a band gap wavelength of 1.2 μm and a thickness of 3 μm, a non-doped GaInAs layer (or light absorption layer) 23 having a band gap wavelength of 1.65 μm and a thickness of 2 μm, a p-GaInAsP layer (or light confining layer) 24 having a carrier concentration of $1 \times 10^{18} cm^{-3}$, a band gap wavelength of 1.2 μm and a thickness of 3 μm, a p-InP cladding layer 25 having a carrier concentration of $1 \times 10^{18} cm^{-3}$ and a thickness of 2 μm, and a p-GaInAs layer (or a contact layer) 26 having a carrier concentration of $2 \times 10^{18} cm^{-3}$, a band gap wavelength of 1.65 μm and a thickness of 0.3 μm in due order.

The composition of each of the semiconductor layers was selected to lattice-match the n-InP substrate 21.

An etching process as described hereinafter was conducted to the layered structure to thereby form a mesa stripe structure. It is noted that the mesa stripe structure to be formed was in the same direction as described In Embodiment 1.

(1) First, using a mixture solution (C) of bromine and methanol with a mixture volume ratio of 1:300, etching was conducted from the p-GaInAs layer 26 to the n-GaInAsP layer (or light confining layer) 22 at room temperature. Etched amounts were controlled based on etching time. When the n-GaInAsP layer (or light confining layer) 22 was etched by approximately 0.5 μm, etching was stopped and a mesa stripe structure was formed.

The side surface of the formed mesa stripe structure was flat (111) plane having an inclination of approximately 54°.

(2) Next, using as etchant a mixture solution (D) of water-saturated bromine, hydrogen bromide and pure water with a mixture volume ratio of 1:1:10, the side surface of the above-described mesa stripe structure was etched at a temperature of 21° C.

When the mesa stripe structure after etching was observed by a scanning electron microscope, respective semiconductor layers were, as shown in FIG. 6, curved differently on the side surface of the mesa stripe structure. However, the n-GaInAsP layer 22, the non-doped GaInAs layer 23 and the P-GaInAsP layer 24 were curved to have a projection outside and their radiuses of curvature were approximately 62.5 μm.

Thereafter, as in the same manner as Embodiment 1, a dielectric layer and electrodes were formed by using the semiconductor waveguide, thus forming a photo detector.

This photo detector has a function which absorbs both light of a wavelength of 1.3 μm and light of a wavelength of 1.55 μm.

Signal light was incident on the photo detector from an optical fiber having a mode field diameter of 6 μm and light receiving sensitivity was measured. It was found that the photo detector received light of a wavelength of 1.3 μm with a high sensitivity of 0.95 A/W and light of a wavelength of 1.55 μm with a high sensitivity of 1.0 A/W.

Also, signal light was incident on the photo detector from a multimode optical fiber having a mode field diameter of 50 μm and light receiving sensitivity was measured. It was found that the photo detector received light of a wavelength of 1.3 μm with a high sensitivity of 0.7 A/W and light of a wavelength of 1.55 μm with a high sensitivity of 0.75 A/W.

When dark current was measured at a reverse bias voltage of 3 V, an average measured value of 100 devices was 100 pA.

Compared with the conventional devices, dark current characteristics of the photo detector in this embodiment according to the present invention were improved by two to three digits.

Embodiment 3

Figure 7:
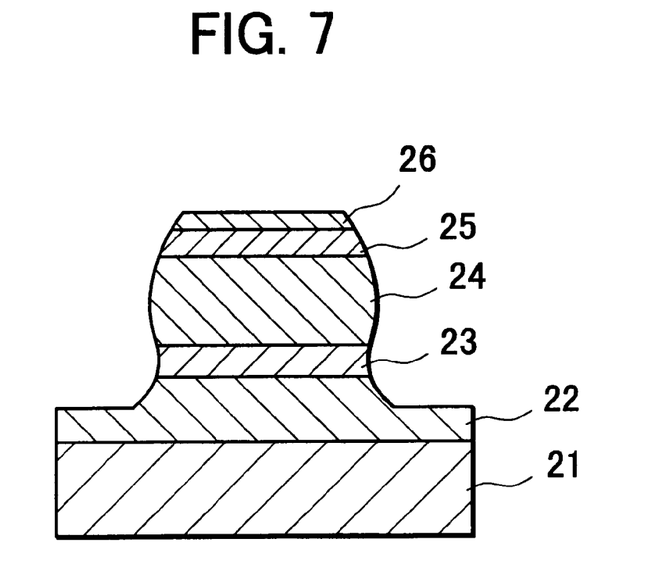
FIG. 7 is a cross-sectional view showing the shape of the side surface of a mesa stripe structure in a third embodiment according to the present invention.

The layered structure shown in Embodiment 2 was etched and the mesa stripe structure having the side face shape as shown in FIG. 7 was formed. The direction of the mesa stripe to be formed was the same as that in the case of Embodiment 1.

(1) First, using chlorine gas as an etchant, dry etching was conducted from the p-GaInAs layer 26 to the n-GaInAsP layer 22. The etching process was stopped when the n-GaInAsP layer 22 was etched by approximately 0.2 μm.

In dry etching, it is possible to conduct etching at an arbitrary angle by selecting used gas and etching conditions. In this embodiment, such conditions that the side surface of the mesa stripe structure is a flat surface perpendicular to the n-InP substrate 21 were selected.

(2) Next, using the above-described solution (D) as etchant, the vertical flat surface of the formed mesa stripe structure was etched.

When the mesa stripe structure after etching was observed by a scanning electron microscope, respective semiconductor layers were, as shown in FIG. 7, curved differently on the side surface of the mesa stripe structure. However, the n-GaInAsP layer 22 was curved to have a projection inside, the non-doped GaInAs layer 23 was also curved to have a projection inside, and the P-GaInAsP layer 24 was curved to have a projection outside. Their radiuses of curvature were approximately 100 μm.

Thereafter, as in the same manner as Embodiment 2, a dielectric layer and electrodes were formed by using the semiconductor waveguide, thus forming a photo detector.

Signal light was incident on the photo detector from an optical fiber having a mode field diameter of 6 μm and light receiving sensitivity was measured. It was found that the photo detector received light of a wavelength of 1.3 μm with a high sensitivity of 0.95 A/W and light of a wavelength of 1.55 μm with a high sensitivity of 1.0 A/W.

Also, signal light was incident on the photo detector from a multimode optical fiber having a mode field diameter of 50 μm and light receiving sensitivity was measured. It was found that the photo detector received light of a wavelength of 1.3 μm with a high sensitivity of 0.7 A/W and light of a wavelength of 1.55 μm with a high sensitivity of 0.75 A/W.

When dark current was measured at a reverse bias voltage of 3 V, an average measured value of 100 devices was 100 pA.

Although the side surface configuration of the mesa stripe structure in this embodiment differs from that in Embodiment 2, the photo detector in this embodiment according to the present invention exhibited the same dark current characteristics as those in Embodiment 2.

Embodiment 4

Figure 8:
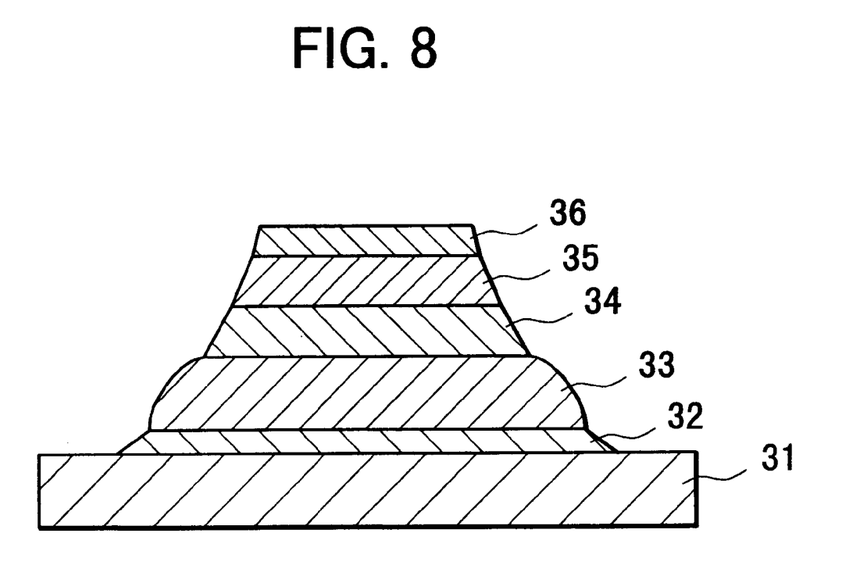
FIG. 8 is a cross-sectional view showing the shape of the side surface of a mesa stripe structure in a fourth embodiment according to the present invention.

A semiconductor waveguide having a side surface configuration as shown in FIG. 8 was manufactured as follows.

On an n-InP substrate 31 having a carrier concentration of $5 \times 10^{18} cm^{-3}$, there were provided an n-GaInAsP layer (or light confining layer) 32 having a carrier concentration of $1 \times 10^{18} cm^{-3}$, a band gap wavelength of 1.15 μm and a thickness of 0.5 μm, a non-doped GaInAsP layer (or light absorption layer) 33 having a band gap wavelength of 1.4 μm and a thickness of 3 μm, a p-GaInAsP layer (or light confining layer) 34 having a carrier concentration of $1 \times 10^{18} cm^{-3}$, a band gap wavelength of 1.15 μm and a thickness of 2 μm, a p-InP cladding layer 35 having a carrier concentration of $1 \times 10^{18} cm^{-3}$ and a thickness of 2.1 μm, and a p-GaInAsP layer (or a contact layer) 36 having a carrier concentration of $2 \times 10^{19} cm^{-3}$, a band gap wavelength of 1.15 μm and a thickness of 0.3 μm in due order.

The composition of each of the semiconductor layers was selected to lattice-match the n-InP substrate 31.

Next, an SiNx film having a thickness of 0.1 μm was formed on the contact layer 36 of the lamination structure and a resist film was formed on the SiNx film. A stripe pattern to be formed was generated by using a photolithographic technique. It is noted that the mesa stripe structure to be formed was in such a direction as to provide an inverse mesa stripe structure, i.e., in the direction of plane (0-11).

After removing the SiNx film except for the stripe pattern, the resist film left on the stripe pattern was further etched away. As a result, the stripe pattern of an SiNx film was formed on the upper surface of the above-described lamination structure.

Using this SiNx film as a mask, a mesa stripe structure was formed as follows.

(1) First, using the solution (A) used in Embodiment 1 as an etchant, etching was conducted at room temperature. The p-GaInAsP layer 36 was etched. Since the solution (A) did not dissolve InP, etching was automatically stopped on the surface of the p-InP cladding layer 35.

(2) Next, using the solution (B) used in Embodiment 1 as an etchant, etching was conducted at room temperature. The p-InP cladding layer 35 was etched. Since the solution (B) did not dissolve GaInAsP, etching was stopped automatically on the surface of the p-GaInAsP layer 34.

(3) Moreover, using a mixture solution (E) of bromine and methanol with a mixture volume ratio of 1:200, etching was conducted at room temperature to give the entire etched thickness of 8 μm, thereby forming a mesa stripe structure.

Since the selection ratio of the solution (E) was very small, etching depth was controlled in accordance with etching time.

Unlike Embodiment 2, the direction of the mesa stripe structure was shifted by 90°, so that the side surface of the resultant mesa stripe structure was curved.

Now, photoreactive polyimide was buried in the grooves between mesa stripes of the thus manufactured semiconductor waveguide and the depth of the groove between mesa stripes was shallower to 4 to 5 μm. At this time, the curved surface of the non-doped GaInAsP layer (or light absorption layer) 33 is buried by the photoreactive polyimide.

Next, a mask pattern for the formation of an ohmic electrode is formed on the contact layer 36 of the mesa stripe structure by using an ordinary photolithographic technique. Thereafter, a p-type ohmic electrode was vapor-deposited and mounted on the mask pattern.

To facilitate producing chips, the thickness of the n-InP substrate 31 was adjusted to 120 μm by polishing the back surface thereof, and an n-type ohmic electrode was vapor-deposited and mounted on the back surface thereof.

In the next scribe step, the waveguide was cleaved to have the shape of a bar having a width of 300 μm, thereby providing an element having a cleaved end face.

The cleaved end face was etched as follows.

Figure 9:
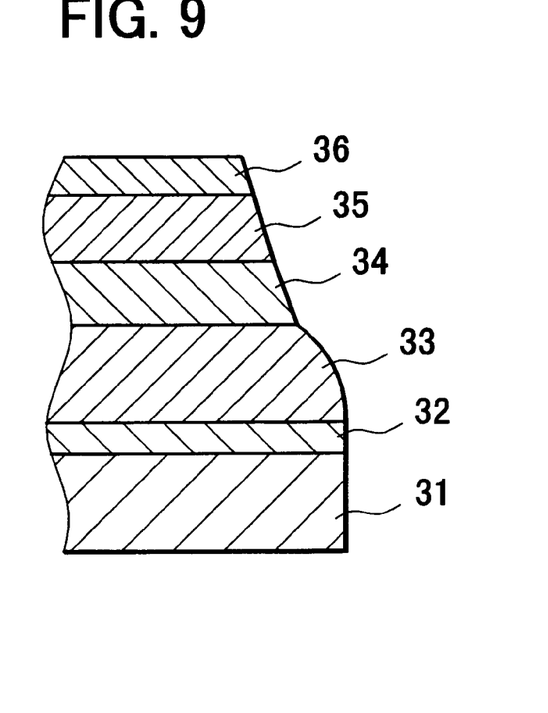
FIG. 9 is a cross-sectional view showing the shape of light incidence end face of a semiconductor waveguide in a photo detector in the fourth embodiment according to the present invention.

(5) The element was dipped in the solution (D) used in Embodiment 2 at a temperature of 21° for 8 seconds.

As a result, the cleaved end face of the non-doped GaInAsP layer (or light absorption layer) 33 was curved to have a projection outside as shown in FIG. 9. The curved surface was observed by a scanning electron microscope and its radius of curvature was measured as approximately 100 μm.

In the processes until now, although the electrodes etc. are exposed to the etchant, the electrodes etc. are less affected because they are dipped for a short period of time. In order to surely hinder the effect of etchant on the electrodes etc., it is only necessary to form a protective film, for example, by coating the surface of the whole with resist or wax, and to remove the protective film after etching.

Finally, a nonreflective film was formed by vapor-depositing an SiNx on the end face, thus forming a photo detector.

The photo detector has a wavelength selection function which absorbs light of a wavelength of 1.3 μm but not light of a wavelength of 1.55 μm.

Signal light was incident on the photo detector from an optical fiber having a mode field diameter of 6 μm and light receiving sensitivity was measured. It was found that the photo detector received light of a wavelength of 1.3 μm with a high sensitivity of 0.98 A/W.

Also, signal light was incident on the photo detector from a multimode optical fiber having a mode field diameter of 50 μm and light receiving sensitivity was measured. It was found that the photo detector received light of a wavelength of 1.3 μm with a high sensitivity of 0.85 A/W. Considering that the sensitivity of the photo detectors in Embodiments 1 to 3 was 0.7 A/W, a great effect was obtained in this embodiment.

When dark current was measured at reverse bias voltages of 3 V and 5 V, average measured values of 100 devices were quite low, that is, 70 pA and 150 pA, respectively.

In case of the conventional photo detector made of the same material as in this embodiment, having the same lamination structure as in this embodiment, but without a curved surface of the side of stripe structure and a curved surface of cleaved end face, dark current at reverse bias voltages of 3V and 5V was 700 pA and 1 nA, respectively. Judging from this, it was found that dark current characteristics of the photo detector in this embodiment according to the present invention were improved by one digit or more.

Embodiment 5

A photo detector was manufactured in the same manner as Embodiment 4 except that after cleavage, cleaved end faces were etched as follows.

Figure 10:
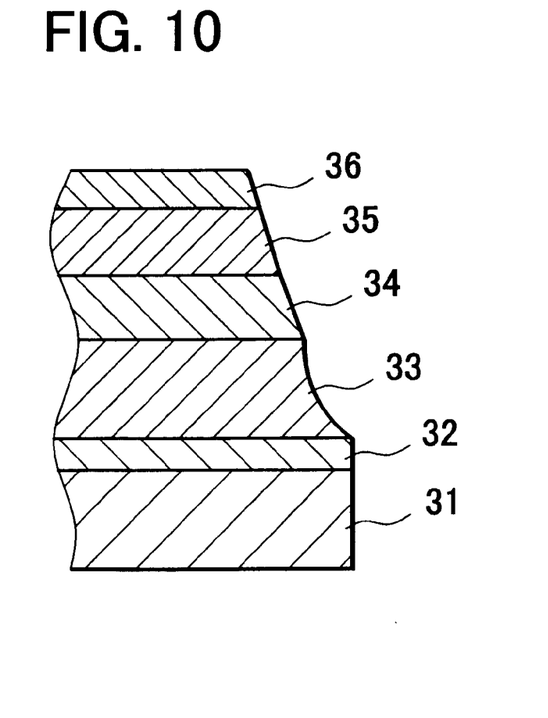
FIG. 10 is a cross-sectional view showing the shape of light incidence end face of a semiconductor waveguide in a photo detector in fifth and sixth embodiments according to the present invention.

(6) The element after cleavage was dipped in a mixture solution (F) of hydrochloric acid, acetic acid and hydrogen peroxide water with a mixture volume ratio of 1:2:1 at a liquid temperature of 18° for 10 seconds.

As a result, among cleaved end faces, that of the non-doped GaInAsP layer (or light absorption layer) 33 was curved to have a projection inside as shown in FIG. 10. The curved surface was observed by a scanning electron microscope and its radius of curvature was measured as approximately 120 $\mu$m.

Signal light was incident on the photo detector from an optical fiber having a mode field diameter of 6 $\mu$m and light receiving sensitivity was measured. It was found that the photo detector received light of a wavelength of 1.3 $\mu$m with a high sensitivity of 0.92 A/W.

Also, signal light was incident on the photo detector from a multimode optical fiber having a mode field diameter of 50 $\mu$m and light receiving sensitivity was measured. It was found that the photo detector received light of a wavelength of 1.3 $\mu$m with a high sensitivity of 0.83 A/W. In this case as well, considering that the sensitivity of the photo detectors in Embodiments 1 to 3 was 0.7 A/W, a great effect was obtained in this embodiment.

When dark current was measured at reverse bias voltages of 3 V and 5 V, average measured values of 100 devices were quite low, that is, 90 pA and 180 pA, respectively.

Embodiment 6

A photo detector was manufactured in the same manner as Embodiment 4 except that after cleavage, cleaved end faces were etched as follows.

(7) Using the solution (A) used in Embodiment 1 as etchant, the device was dipped therein at room temperature for 30 seconds.

As a result, among cleaved end faces, that of the non-doped GaInAsP layer (or light absorption layer) 33 was curved to have a projection inside as shown in FIG. 10. The curved surface was observed by a scanning electron microscope and its radius of curvature was measured as approximately 150 $\mu$m.

Signal light was incident on the photo detector from an optical fiber having a mode field diameter of 6 $\mu$m and light receiving sensitivity was measured. It was found that the photo detector received light of a wavelength of 1.3 $\mu$m with a high sensitivity of 0.92 A/W.

Also, signal light was incident on the photo detector from a multimode optical fiber having a mode field diameter of 50 $\mu$m and light receiving sensitivity was measured. It was found that the photo detector received light of a wavelength of 1.3 $\mu$m with a high sensitivity of 0.83 A/W. In this case as well, considering that the sensitivity of the photo detectors in Embodiments 1 to 3 was 0.7 A/W, a great effect was obtained in this embodiment.

When dark current was measured at reverse bias voltages of 3 V and 5 V, average measured values of 100 devices were quite low, that is, 80 pA and 170 pA, respectively.

Embodiment 7

After a lamination structure was formed in the same manner as Embodiment 4, the direction of the mesa stripe structure to be formed was set to the direction of (011) plane, and the lamination structure was etched as follows.

(8) First, using the solution (A) used in Embodiment 1 as etchant, the p-GaInAsP layer 36 was wet etched away.

(9) Next, using a methane mixture gas, dry etching was conducted from the InP layer 35 to a halfway position of the InGaAsP layer 32.

As a result, since the direction of the mesa stripe structure differed from that in Embodiment 1, the side surface thereof was forward mesa. Also, the light incidence end face of the non-doped GaInAsP layer (or light absorption layer) 33 was a plane having an inclination of approximately 17°.

Using this waveguide, a photo detector was manufactured in the same manner as Embodiment 4.

Signal light was incident on the photo detector from an optical fiber having a mode field diameter of 6 $\mu$m and light receiving sensitivity was measured. It was found that the photo detector received light of a wavelength of 1.3 $\mu$m with a high sensitivity of 0.99 A/W.

Also, signal light was incident on the photo detector from a multimode optical fiber having a mode field diameter of 50 $\mu$m and light receiving sensitivity was measured. It was found that the photo detector received light of a wavelength of 1.3 $\mu$m with a high sensitivity of 0.88 A/W. In this case as well, considering that the sensitivity of the photo detectors in Embodiments 1 to 3 was 0.7 A/W, a great effect was obtained in this embodiment.

When dark current was measured at reverse bias voltages of 3 V and 5 V, average measured values of 100 devices were quite low, that is, 200 pA and 500 pA, respectively.

INDUSTRIAL APPLICABILITY

Thus, for the photo detector in accordance with the present invention, the side surface and/or the light incidence end of at least the light absorption layer of the mesa stripe structure for the semiconductor waveguide are curved, so that the dangling bond density in the unit cell is low, and the leak path is long. Therefore, the occurrence of leak current is reduced and the dark current characteristics are excellent.

What is claimed is:

1. A semiconductor waveguide type photo detector comprising a layered structure formed on a semiconductor substrate, said layered structure formed by a first semiconductor layer, a second semiconductor layer and a third semiconductor layer, said first semiconductor layer being one of a p type or an n type, said second semiconductor layer being provided on said first semiconductor layer, said second semiconductor layer having a lower band gap energy than that of said first semiconductor layer, said third semiconductor layer being provided on said second semiconductor layer, said third semiconductor layer having a higher band gap energy than that of said second semiconductor layer, said third semiconductor layer having a conductive type opposite to that of said first semiconductor layer, wherein at least said second semiconductor layer of said layered structure includes a semiconductor waveguide having a mesa stripe structure, and a side surface of at least said second semiconductor layer is curved to suppress leak current, wherein the side surface has a radius of curvature of 5 to 200 μm.

2. A semiconductor waveguide type photo detector according to claim 1, wherein a light incidence end face of at least said second semiconductor layer is an inclined plane at an acute angle with respect to the surface of said semiconductor substrate.

3. A semiconductor waveguide type photo detector according to claim 1, wherein the second semiconductor layer is made of GaInAsP.

4. A semiconductor waveguide type photo detector according to claim 1, wherein the second semiconductor layer is made of AlGaInAs.

5. A semiconductor waveguide type photo detector comprising a layered structure formed on a semiconductor substrate, said layered structure formed by a first semiconductor layer, a second semiconductor layer and a third semiconductor layer, said first semiconductor layer being one of a p type or an n type, said second semiconductor layer being provided on said first semiconductor layer, said second semiconductor layer having a lower band gap energy than that of said first semiconductor layer, said third semiconductor layer being provided on said second semiconductor layer, said third semiconductor layer having a higher band gap energy than that of said second semiconductor layer, said third semiconductor layer having a conductive type opposite to that of said first semiconductor layer, wherein at least said second semiconductor layer of said layered structure includes a semiconductor waveguide having a mesa stripe structure, and a side surface of at least said second semiconductor layer is curved to suppress leak current, wherein the side surface which is curved has a convex shape.

* * * * *